(12) United States Patent
Courtney

(10) Patent No.: US 11,600,730 B2
(45) Date of Patent: Mar. 7, 2023

(54) SPIRAL TRANSIENT VOLTAGE SUPPRESSOR OR ZENER STRUCTURE

(71) Applicant: Semtech Corporation, Camarillo, CA (US)

(72) Inventor: David Francis Courtney, McAllen, TX (US)

(73) Assignee: MICROSS CORPUS CHRISTI CORPORATION, Apopka, FL (US)

( * ) Notice: Subject to any disclaimer, the term of this patent is extended or adjusted under 35 U.S.C. 154(b) by 0 days.

(21) Appl. No.: 17/111,181

(22) Filed: Dec. 3, 2020

(65) Prior Publication Data

US 2022/0181503 A1 Jun. 9, 2022

(51) Int. Cl.
*H01L 29/66* (2006.01)
*H01L 29/866* (2006.01)
*H01L 29/06* (2006.01)

(52) U.S. Cl.
CPC ........ *H01L 29/866* (2013.01); *H01L 29/0688* (2013.01); *H01L 29/0692* (2013.01); *H01L 29/66106* (2013.01)

(58) Field of Classification Search
CPC ... H01L 29/866; H01L 29/868; H01L 29/861; H01L 29/0649; H01L 29/0692; H01L 29/0688; H01L 29/6606; H01L 29/66083; H01L 29/66106; H01L 29/882; H01L 29/885; H01L 29/66143; H01L 29/66151; H01L 29/66159; H01L 29/66219; H01L 27/0248; H01L 27/0255; H01L 27/0292; H01L 27/0296; H01L 27/0811; H01L 27/0814; H01L 27/0817; H01L 29/8611;

(Continued)

(56) References Cited

U.S. PATENT DOCUMENTS 4,652,895 A    3/1987 Roskos
7,642,599 B2 * 1/2010 Ninomiya ............. H01L 29/404
                                                          257/355

(Continued)

FOREIGN PATENT DOCUMENTS

CN    101431073 A    5/2009
CN    102569374 B    1/2012

(Continued)

OTHER PUBLICATIONS

Extended European Search Report dated Apr. 21, 2022 for co-pending European Patent Application No. EP21212110.7, mailed by the European Patent Office, 10 pages.

(Continued)

*Primary Examiner* — Natalia A Gondarenko
(74) *Attorney, Agent, or Firm* — Jackson Walker LLP; Christopher J. Rourk

(57) ABSTRACT

A transient voltage suppressor is disclosed that includes an electrode, a substrate disposed on the electrode, the substrate having a first doping, an epitaxial layer disposed on the substrate, the epitaxial layer having a second doping that is different from the first doping, a channel formed in the epitaxial layer having a width W, a length L and a plurality of curved regions, the channel forming a plurality of adjacent sections, the channel having a third doping that is different from the first doping and the second doping and a metal layer formed on top of the channel and contained within the width W of the channel.

18 Claims, 6 Drawing Sheets

(58) Field of Classification Search
CPC . H01L 29/8613; H01L 29/36; H01L 29/0619; H01L 29/0638; H01L 29/0661; H01L 29/0834; H01L 29/402; H01L 29/407; H01L 29/7396; H01L 27/0259; H01L 27/0266; H01L 27/0664; H01L 27/0684; H01L 27/0649; H01L 27/0727
USPC ....... 257/603, 332, 355, 328, 488, 605, 173, 257/175, 360, 401, 452
See application file for complete search history.

(56) References Cited

U.S. PATENT DOCUMENTS

| | | | |
|---|---|---|---|
| 9,653,515 | B2 | 5/2017 | Yoon et al. |
| 10,636,786 | B2 * | 4/2020 | Shinsho .............. H01L 29/0834 |
| 2005/0275065 | A1 * | 12/2005 | Cogan .................. H01L 29/866 |
| | | | 257/605 |
| 2006/0131605 | A1 * | 6/2006 | Cogan .................. H01L 29/861 |
| | | | 257/173 |
| 2013/0075747 | A1 | 3/2013 | Purtell |
| 2013/0175670 | A1 | 7/2013 | Chen |
| 2015/0091041 | A1 | 4/2015 | Yoon et al. |
| 2016/0035713 | A1 | 2/2016 | Iwamoto |
| 2017/0025402 | A1 | 1/2017 | Opoczynski et al. |
| 2017/0373158 | A1 * | 12/2017 | Mallikarjunaswamy .................... H01L 23/552 |

FOREIGN PATENT DOCUMENTS

| | | |
|---|---|---|
| CN | 102544065 B | 6/2014 |
| CN | 107425047 A | 12/2017 |
| CN | 208173620 U | 11/2018 |
| JP | H06120429 A | 4/1994 |

OTHER PUBLICATIONS

Krizaj, et al., "Diffused Spiral Junction Termination Structure: Modeling and Realization", 1996, IEEE, pp. 247-250.

* cited by examiner

SPIRAL TRANSIENT VOLTAGE SUPPRESSOR OR ZENER STRUCTURE

TECHNICAL FIELD

The present disclosure relates generally to integrated circuits, and more specifically to a spiral well and terminal structure for a transient voltage suppressor or Zener diode device that provides for increased power handling capability.

BACKGROUND OF THE INVENTION

Transient voltage suppressors, such as a Zener diode, are generally low power devices.

SUMMARY OF THE INVENTION

A transient voltage suppressor is disclosed that includes an electrode and a substrate disposed on the electrode. The substrate has a first doping, and an epitaxial layer disposed on the substrate that has a second doping different from the first doping. A channel is formed in the epitaxial layer having a width W, a length L and a plurality of curved regions, and the channel forms a plurality of adjacent sections. The channel has a third doping that is different from the first doping and the second doping. A metal layer is formed on top of the channel and is contained within the width W of the channel.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIGS. 4A-4E are diagrams of stages in an integrated circuit fabrication process, in accordance with an example embodiment of the present disclosure.

DETAILED DESCRIPTION OF THE INVENTION

Figure 1:
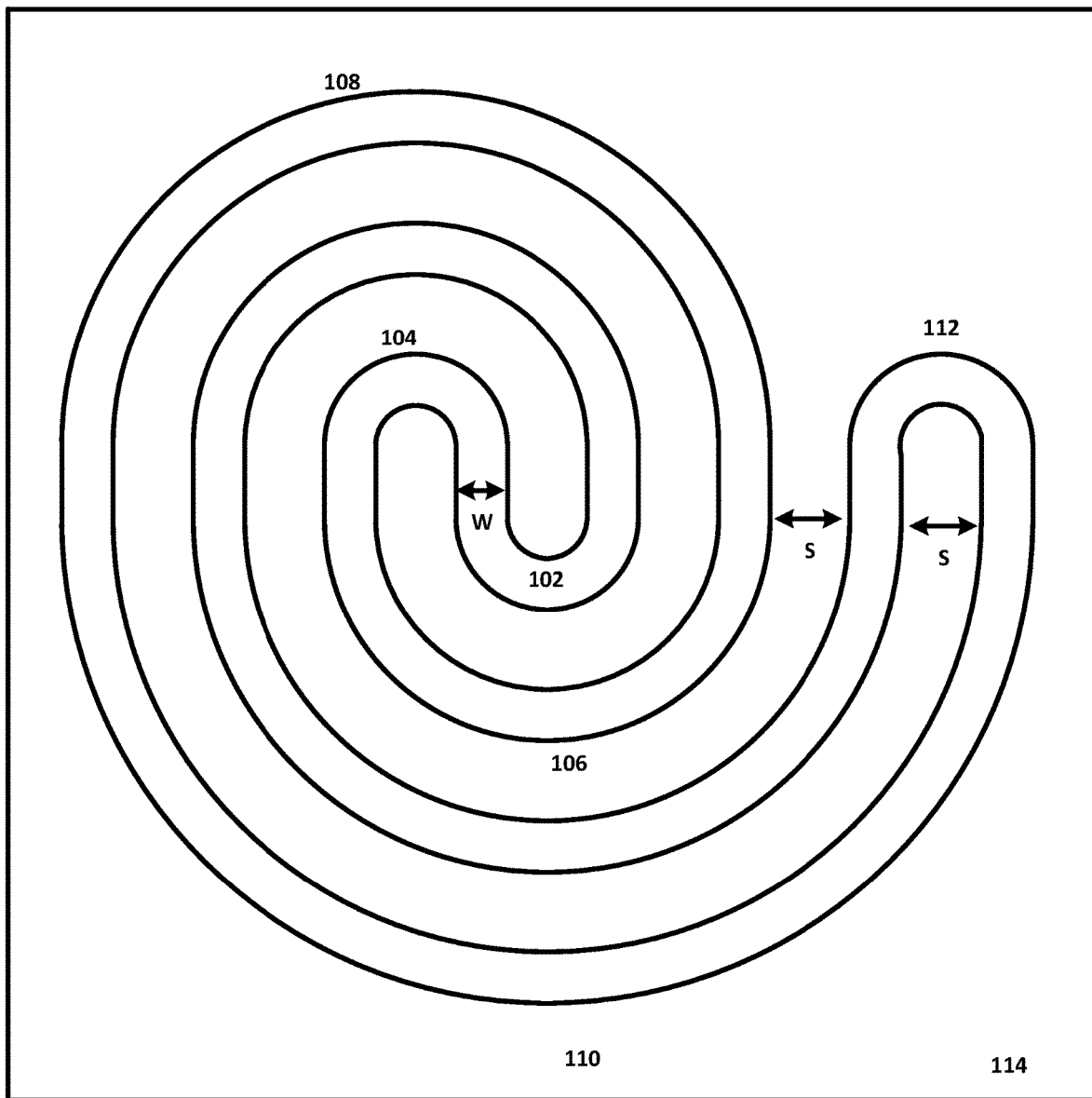
FIG. 1 is a diagram of a device with a long junction edge, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

The present disclosure is directed to a low voltage, high power transient voltage suppressor, Zener diode or other suitable device architecture, such as for use in applications where the power rating of the device is 500 watts or greater. The present disclosure provides a device with a low capacitance and low leakage current, due to the use of low levels of doping. In contrast, the typical design of a transient voltage suppressor uses high doping concentrations in the substrate, and the die size is used to control the power rating of the device.

By providing a device with a long edge through the use of long curved structures, in addition to the use of lower doping levels, the present disclosure allows more power to be handled by the device. In one example, the present disclosure uses cylindrical curvature to avoid problems caused by prior art spherical curvature architectures. A cylindrical curvature architecture provides a constant curvature, so that the device sees bends as straight ends. By providing a large ratio of the radius of curvature versus the depth into silicon, a uniform breakdown characteristic is provided.

In addition, the present disclosure uses control of the alpha coefficient to spread breakdown. As a device in accordance with the present disclosure gets hot, breakdown increases with temperature and spreads. At low voltage and high concentrations, the device operates in Zener mode, and when the device gets hot, the breakdown voltage falls, creating localized hot spots. At high voltage and low concentration, the device operates in avalanche mode, and when the device gets hot, the breakdown voltage level rises, this results in spreading power that smooths out localized hotspots. For use with a power transient voltage suppressor, at low voltage, a Zener diode is acceptable at low power, but an avalanche diode works better at high power.

In order to accomplish these objective, the present disclosure uses a spiral contact area. The use of the spiral geometry allows for a constant distance from edge to edge and from section to section, which helps to minimize local heating. The spiral geometry also eliminates sharp corners that can produce localized breakdown. The long edge path of a spiral design allows high power applications to be supported. Control of breakdown is accomplished by controlling the ratio of the electrode junction curvature to the width of the electrode, such that the current flow regions slightly overlap when the device is in Zener breakdown mode.

For a silicon device, the doping of the substrate can be an N++ doping level using phosphorus, arsenic, antimony or other suitable N++ materials. An epitaxial layer can then use an N+ doping level using phosphorus, arsenic, antimony or other suitable N+ doping materials. An electrode with a P+ doping level can then be formed using boron, aluminum or other suitable P+ materials. A screening oxide layer is then formed to reduce defect formation, and a photo resist layer is then formed to implant the P+ electrode doping. The device is then annealed to activate the dopant, and a passivation oxide layer such as an N-type semi-insulating polycrystalline silicon (SIPOS) or doped silicon oxide can be formed. A layer of photoresist is then applied and etched to form the metal contacts and metal base, such as using a barrier metallization process with titanium, nickel, silver or other suitable materials.

Manufacturing of low voltage, high power (>500 W) transient voltage suppressors can be accomplished using high concentration dopants, which results in high capacitance and high leakage. In the case of low voltage Zener diodes, voltage control can be accomplished by junction curvature, to allow for lower concentration epitaxial layers that provide lower capacitance and leakage. One disadvantage of the Zener structure is that the edge breakdown has low power transient power capabilities, because the breakdown is confined to the area of the curvature, which is small compared to the area of the die. The present disclosure provides a long junction edge, which results in a larger breakdown region and higher power handling capabilities.

FIG. 1 is a diagram of a device 100 with a long junction edge, in accordance with an example embodiment of the present disclosure. Device 100 can be fabricated using silicon, germanium, gallium arsenide, using metal-oxide semiconductor processes and materials, or in other suitable manners.

Device 100 includes metal layer 102, which is formed on top of a suitable doped region, such as a P+ doped region that forms a channel in an N+ epitaxial layer 114 over an N++ substrate or other suitable device architectures. Metal layer 102 has a thickness "W," a length "L" that is substantially greater than the thickness, and includes curved regions 104, 106, 108 and 110, and terminates at curved region 112. The distance "S" between the adjacent metal layers and their associated underlying doped regions is constant at all adjacent locations, within a predetermined manufacturing tolerance that is selected as a function of device application, voltage, power and other design constraints. Typically, a higher tolerance is required for applications that require a higher voltage or a higher power rating. The use of the spiral geometry of device 100 provides for a constant distance from edge to edge of metal layer 102 as well as from section to section, which helps to minimize local heating. Because sharp corners are avoided, localized breakdown can be reduced or minimized. The long edge path of device 100 allows operation at higher power.

Figure 2:
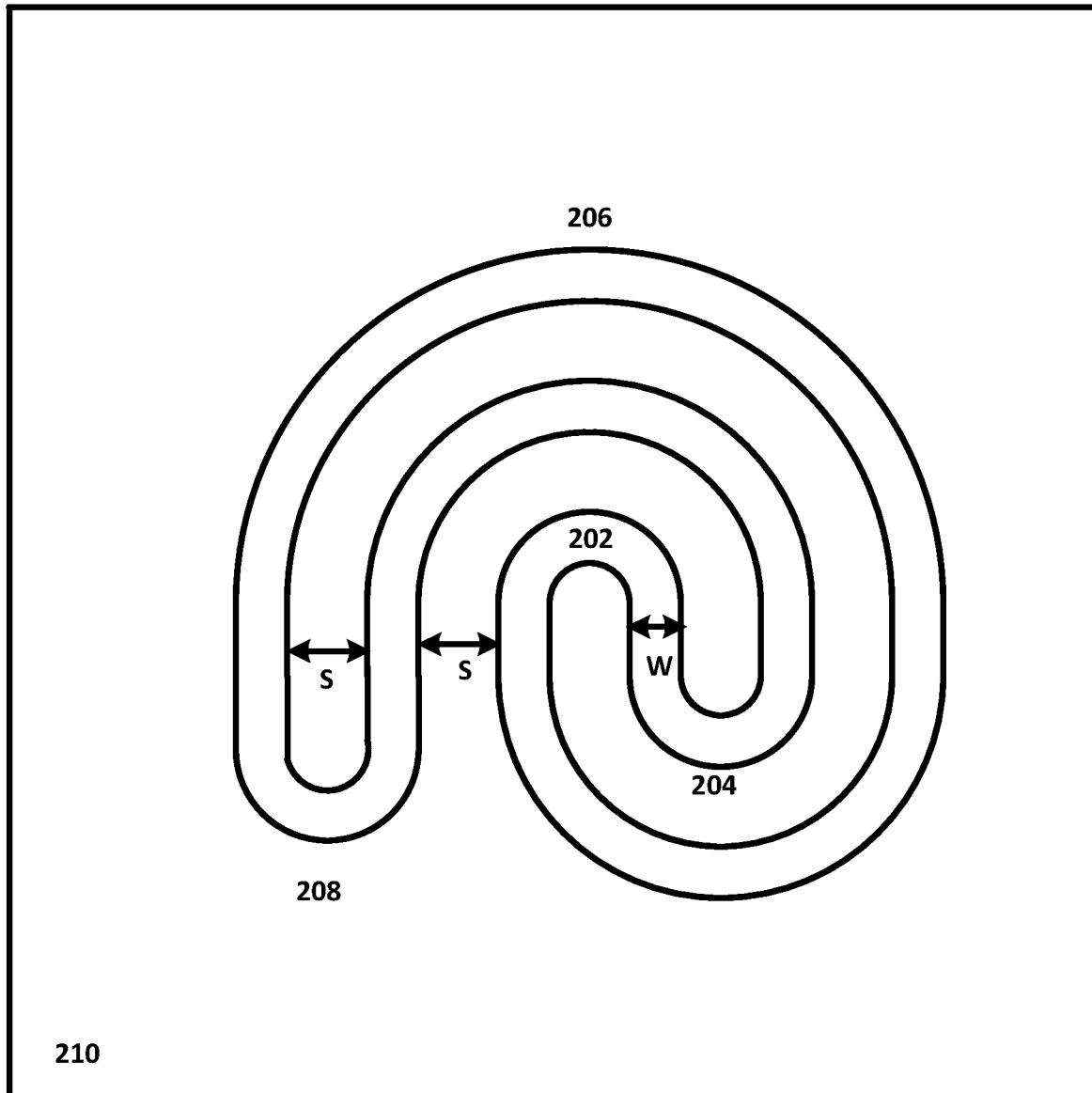
FIG. 2 is a diagram of a device with an intermediate junction edge, in accordance with an example embodiment of the present disclosure.

FIG. 2 is a diagram of a device 200 with an intermediate junction edge, in accordance with an example embodiment of the present disclosure. Device 200 can be fabricated using silicon, germanium, gallium arsenide, using metal-oxide semiconductor processes and materials, or in other suitable manners.

Device 200 includes metal layer 202, which is formed on top of a suitable doped region, such as a P+ doped region that forms a channel in an N+ epitaxial layer 210 over an N++ substrate or other suitable device architectures. Metal layer 202 has a thickness "W," a length "L" that is substantially greater than the thickness "W" but shorter than the length "L" of the metal layer 102 of device 100, and includes curved regions 204 and 206, and terminates at curved region 208. The distance "S" between the adjacent metal layers and their associated underlying doped regions is constant at all locations, within a predetermined manufacturing tolerance that is selected as a function of device application, voltage, power and other design constraints. Typically, a higher tolerance is required for applications that require a higher voltage or a higher power rating. The use of the spiral geometry of device 200 provides for a constant distance from edge to edge of metal layer 202 as well as from section to section, which helps to minimize local heating. Because sharp corners are avoided, localized breakdown can be reduced or minimized. The long edge path of device 200 allows operation at higher power.

Figure 3:
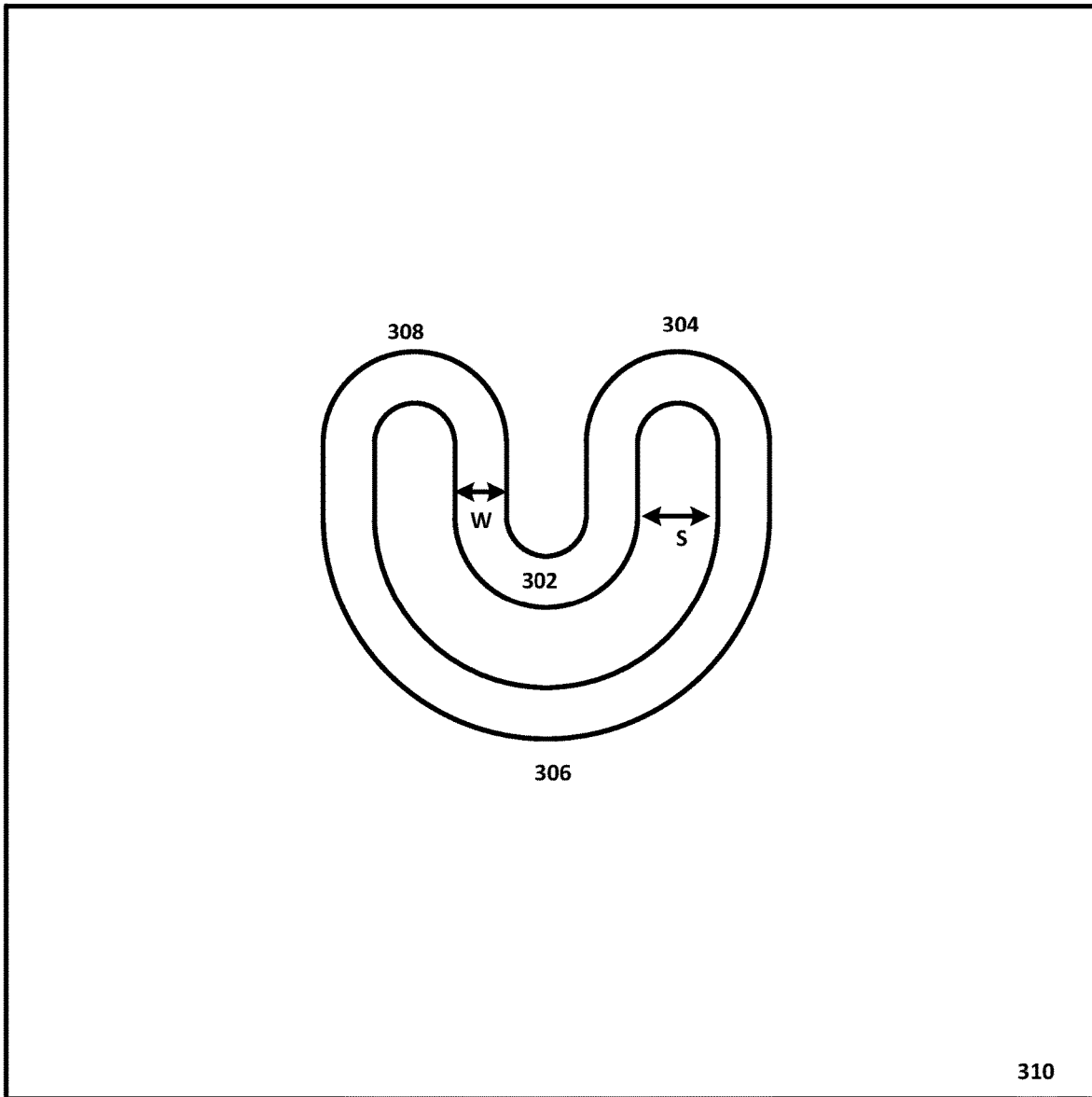
FIG. 3 is a diagram of a device with a junction edge, in accordance with an example embodiment of the present disclosure.

FIG. 3 is a diagram of a device 300 with a junction edge, in accordance with an example embodiment of the present disclosure. Device 300 can be fabricated using silicon, germanium, gallium arsenide, using metal-oxide semiconductor processes and materials, or in other suitable manners.

Device 300 includes metal layer 302, which is formed on top of a suitable doped region, such as a P+ doped region that forms a channel in an N+ epitaxial layer 310 over an N++ substrate or other suitable device architectures. Metal layer 302 has a thickness "W," a length "L" that is substantially greater than "W" but less than the length "L" of device 200, and includes curved regions 304, 306 and 308. The distance "S" between the adjacent metal layers and their associated underlying doped regions is constant at all locations, within a predetermined manufacturing tolerance that is selected as a function of device application, voltage, power and other design constraints. Typically, a higher tolerance is required for applications that require a higher voltage or a higher power rating. The use of the spiral geometry of device 300 provides for a constant distance from edge to edge of metal layer 302 as well as from section to section, which helps to minimize local heating. Because sharp corners are avoided, localized breakdown can be reduced or minimized. The long edge path of device 300 allows operation at higher power.

Figure 4A:

FIGS. 4A-4E are diagrams of stages in an integrated circuit fabrication process, in accordance with an example embodiment of the present disclosure. In FIG. 4A, an N++ doped semiconductor material layer 402 is formed, typically from a wafer of material that is grown from a crystal into ingots that are then sliced. The ingots can be formed from N++ doped semiconductor material, or can be formed from an undoped material and can be doped at a design doping level as part of the manufacturing process, such as by vapor-phase epitaxy or in other suitable manners.

Figure 4B:

In FIG. 4B, an N+ doped semiconductor material epitaxial layer 404 is formed on top of the N++ layer 402. In one example embodiment, the N+ doped semiconductor material layer 404 can be formed in the existing N++ layer 402 by sealing the N++ layer 402 substrate with a low dopant thin silicon film, such as one that is ~2 um thick or other suitable thickness, and then growing the N+ doped semiconductor material epitaxial layer 404 by controlling the dopant level in the reaction chamber. The thin Si seal can be sacrificial to prevent auto-doping during the epitaxial growth process. Likewise, other suitable processes can also or alternatively be used.

In FIG. 4C, a screening oxide layer 406 is formed on top of the N+ layer 404. In one example embodiment, the screening oxide layer 406 can be formed in the existing N+ layer 404 by exposing the N+ layer 404 to an oxidant or in other suitable manners.

In FIG. 4D, P+ wells 408 and 410 are formed in N+ doped semiconductor material epitaxial layer 404. In one example embodiment, the P+ wells 408 and 410 have a width "W" and can be formed by first depositing a layer of photoresist, then etching the photoresist after using a mask and curing the photoresist with a suitable light source to render it amenable to removal with a first chemical agent, to form a pattern that exposes the surface of screening oxide layer 406. A vapor-phase epitaxial process, ion-beam implantation or other suitable processes can then be used to implant the P+ material. The device can then be annealed to activate the P+ dopant.

Figure 4E:
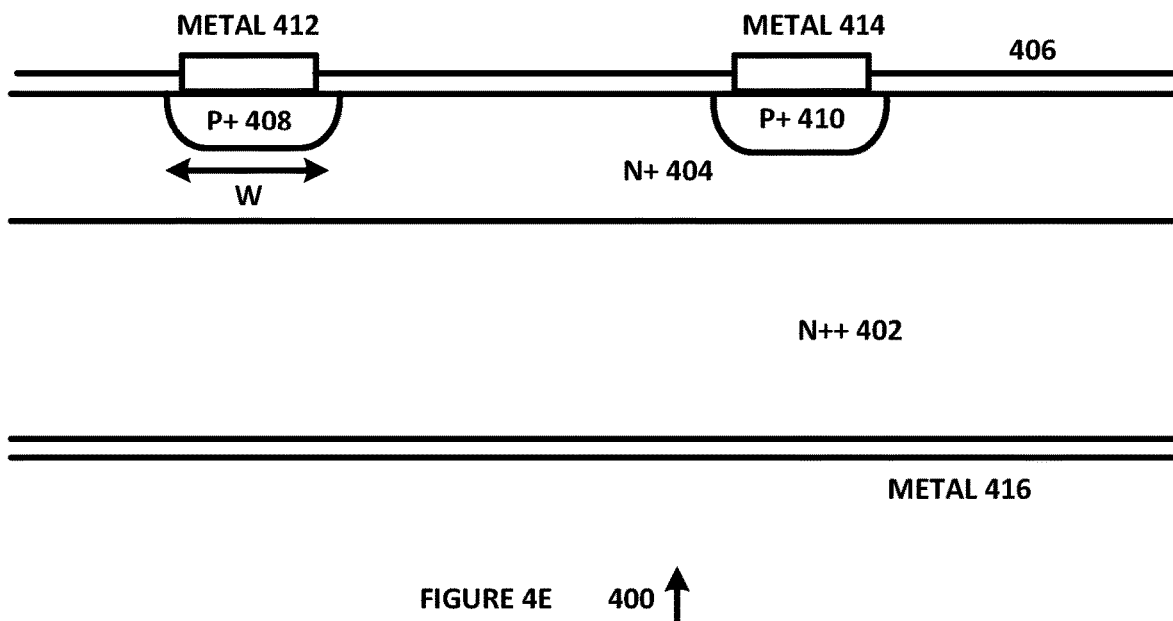

In FIG. 4E, metal contacts 412, 414 and 416 are formed. In one example embodiment, the metal contacts 412 and 414 can be formed by depositing a layer of photoresist, using a mask to form a pattern and then by curing the photoresist using a suitable light source. The cured photoresist is then removed with a chemical agent to form a pattern for metal contacts 412 and 414, or other suitable processes can also or alternatively be used. Vapor-phase deposition, ion-beam implantation or other suitable processes can then be used to form metal contacts 412 and 414 on the top of device 400 and metal contact 416 on the bottom of device 400, such as from titanium, nickel, silver, other suitable metals or suitable combinations of metals. The device can then be quality control inspected and tested to ensure that it functions according to design requirements.

Figure 5:
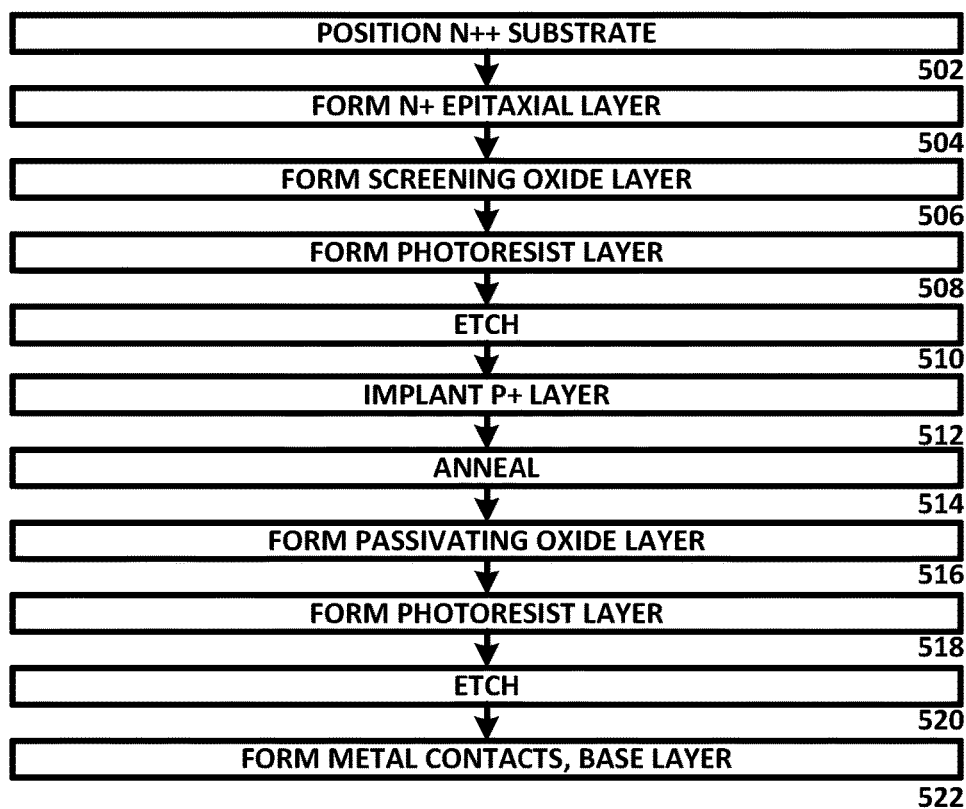
FIG. 5 is an algorithm for an integrated circuit fabrication process, in accordance with an example embodiment of the present disclosure.

FIG. 5 is an algorithm 500 for an integrated circuit fabrication process, in accordance with an example embodiment of the present disclosure. Algorithm 500 can be implemented in conjunction with a programmable semiconductor wafer fabrication controller or in other suitable manners.

Algorithm 500 begins at 502, where an N++ doped substrate is positioned in a semiconductor wafer fabrication assembly. In one example embodiment, the substrate can be formed from N++ doped material that is grown into a ingot and sliced, a neutral base material can be N++ doped by vapor-deposition processing or other suitable processes can also or alternatively be used. The algorithm proceeds to 504.

At 504, an N+ epitaxial layer is formed on top of the N++ substrate layer. In one example embodiment, the N+ epitaxial layer can be formed on the existing N++ layer 402 by sealing the N++ layer 402 substrate with a low dopant thin silicon film, such as one that is ~2 um thick or other suitable thickness, and then growing the N+ doped semiconductor material epitaxial layer by controlling the dopant level in the reaction chamber. The thin Si seal can be sacrificial to prevent auto-doping during the epitaxial growth process. Other suitable processes can also or alternatively be used. The algorithm then proceeds to 506.

At 506, a screening oxide layer is formed on the top surface of the N+ epitaxial layer, such as to protect the N+ epitaxial layer from defects arising from subsequent processing steps. The algorithm then proceeds to 506.

At 508, a photoresist layer is formed to create a pattern or design for P+ implementation. In one example embodiment, the photoresist layer can be formed and a mask can then be used with subsequent exposure to light to cure the photoresist layer. The cured photoresist layer can then be removed with a suitable chemical agent to expose the pattern or design, or other suitable processes can also or alternatively be used. The algorithm then proceeds to 510.

At 510, the cured photoresist layer is etched to remove photoresist from locations where a P+ layer will be implanted. The algorithm then proceeds to 512.

At 512, the P+ layer is implanted, such as by exposing the wafer to predetermined levels of P+ material in vapor form, using ion beam implantation or in other suitable manners. In one example embodiment, the concentration and exposure time of a vapor deposition process can be controlled to yield a P+ layer having predetermined thickness and width parameters, or other suitable processes can also or alternatively be used. The algorithm then proceeds to 514.

At 514, the wafer is annealed, to activate the P+ dopant that was implanted. In one example embodiment, the wafer can be transferred to an annealing chamber or other suitable locations where the temperature is controlled to cause an annealing process to occur. The algorithm then proceeds to 514.

At 516, a passivating oxide layer is formed, such as a N-type SIPOS layer or other suitable passivating oxide layers. The algorithm then proceeds to 518.

At 518, a photoresist layer is deposited and a mask is used to form a pattern for metal contact deposition. The photoresist layer can be cured after the mask has been deployed, to form areas that can subsequently be etched. The algorithm then proceeds to 520.

At 520, the photoresist layer is etched to remove cured photoresist from predetermined areas to allow metal contacts to be formed. The algorithm then proceeds to 522.

At 522, the metal contacts to the P+ layer and the base N++ layer are formed by vapor deposition or other suitable processes. The device is then subjected to quality control testing, packaging and other suitable post-fabrication processing.

In operation, algorithm 500 allows a spiral transient voltage suppressor, Zener diode or other suitable device to be manufactured that provides high power handling capabilities. Although algorithm 500 is shown as a flow chart, one of ordinary skill in the art will recognize that it could also or alternatively be implemented using object-oriented programming, a state diagram, a ladder diagram or in other suitable manners, on one or more different processors.

In accordance with an example embodiment of the present disclosure, a transient voltage suppressor is disclosed that includes an electrode, a substrate disposed on the electrode, the substrate having a first doping, an epitaxial layer disposed on the substrate, the epitaxial layer having a second doping that is different from the first doping, a channel formed in the epitaxial layer having a width W, a length L and a plurality of curved regions, the channel forming a plurality of adjacent sections, the channel having a third doping that is different from the first doping and the second doping and a metal layer formed on top of the channel and contained within the width W of the channel. In other example embodiments of the transient voltage suppressor, the first doping is an N++ doping, the second doping is an N+ doping, the third doping is a P+ doping, the channel forms a closed loop, the channel extends more than 360 degrees in a spiral starting from a center point, the channel extends more than 180 degrees in a spiral starting from a center point, the channel extends more than 90 degrees in a spiral starting from a center point and the channel maintains a constant distance from edge to edge in adjacent sections.

In another example embodiment, a method of manufacturing a transient voltage suppressor comprising forming a substrate having a first doping, forming an epitaxial layer on the substrate, the epitaxial layer having a second doping that is different from the first doping, forming a channel in the epitaxial layer having a width W, a length L and a plurality of curved regions, the channel having a plurality of adjacent sections, the channel having a third doping that is different from the first doping and the second doping and forming a metal layer on top of the channel that is contained within the width W of the channel. In other example embodiments, the method includes the first doping is an N++ doping, the second doping is an N+ doping, the third doping is a P+ doping, the channel forms a closed loop, the channel extends more than 360 degrees in a spiral starting from a center point, the channel extends more than 180 degrees in a spiral starting from a center point, the channel extends more than 90 degrees in a spiral starting from a center point, the channel maintains a constant distance from edge to edge in adjacent sections.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A transient voltage suppressor, comprising:
   an electrode;
   a substrate disposed on the electrode, the substrate having a first doping;
   an epitaxial layer disposed on the substrate, the epitaxial layer having a second doping that is different from the first doping;
   a continuous parallel channel formed in the epitaxial layer having a width W, a length L, a plurality of parallel regions, and a plurality of curved regions, the parallel channel having a plurality of adjacent sections to form a closed spiral loop, the parallel channel having a third doping that is different from the first doping and the second doping; and
   a metal layer formed on top of the parallel channel and contained within the width W of the parallel channel.

2. The transient voltage suppressor of claim 1 wherein the first doping is an N++ doping.

3. The transient voltage suppressor of claim 1 wherein the second doping is an N+ doping.

4. The transient voltage suppressor of claim 1 wherein the third doping is a P+ doping.

5. The transient voltage suppressor of claim 1 wherein the parallel channel extends more than 360 degrees in a spiral starting from a center point.

6. The transient voltage suppressor of claim 1 wherein the parallel channel extends more than 180 degrees in a spiral starting from a center point.

7. The transient voltage suppressor of claim 1 wherein the parallel channel extends more than 90 degrees in a spiral starting from a center point.

8. The transient voltage suppressor of claim 1 wherein the parallel channel maintains a constant distance from edge to edge in adjacent sections.

9. A transient voltage suppressor, comprising:
an electrode;
a substrate disposed on the electrode, the substrate having a first doping;
an epitaxial layer disposed on the substrate, the epitaxial layer having a second doping that is different from the first doping;
a parallel channel formed in the epitaxial layer having a width W, a length L, a plurality of parallel regions, and a plurality of curved regions, the parallel channel having a plurality of continuous adjacent sections to form a closed spiral loop, the parallel channel having a third doping that is different from the first doping and the second doping.

10. The transient voltage suppressor of claim 9 wherein the first doping is an N++ doping.

11. The transient voltage suppressor of claim 9 wherein the second doping is an N+ doping.

12. The transient voltage suppressor of claim 9 wherein the third doping is a P+ doping.

13. The transient voltage suppressor of claim 9 wherein the parallel channel extends more than 360 degrees in a spiral starting from a center point.

14. The transient voltage suppressor of claim 9 wherein the parallel channel extends more than 180 degrees in a spiral starting from a center point.

15. The transient voltage suppressor of claim 9 wherein the parallel channel extends more than 90 degrees in a spiral starting from a center point.

16. The transient voltage suppressor of claim 9 wherein the parallel channel maintains a constant distance from edge to edge in adjacent sections.

17. A transient voltage suppressor, comprising:
an electrode;
a substrate disposed on the electrode, the substrate having a first doping;
an epitaxial layer disposed on the substrate, the epitaxial layer having a second doping that is different from the first doping;
a parallel channel formed in the epitaxial layer having a width W, a length L, a plurality of parallel regions, and a plurality of curved regions, the parallel channel having a first section and turning 180 degrees to form a second section that is adjacent to the first section to form a closed spiral loop, the parallel channel having a third doping that is different from the first doping and the second doping.

18. The transient voltage suppressor of claim 17 further comprising a metal layer formed on top of the parallel channel and contained within the width W of the parallel channel.

* * * * *